(12) United States Patent
Schat

(10) Patent No.: US 11,145,340 B2
(45) Date of Patent: *Oct. 12, 2021

(54) DATA TRANSMISSION CODE AND INTERFACE

(71) Applicant: NXP B.V., Eindhoven (NL)

(72) Inventor: Jan-Peter Schat, Hamburg (DE)

(73) Assignee: NXP B.V., Eindhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 16/837,368

(22) Filed: Apr. 1, 2020

(65) Prior Publication Data

US 2020/0349988 A1 Nov. 5, 2020

(30) Foreign Application Priority Data

Apr. 30, 2019 (EP) ..................... 19171798

(51) Int. Cl.
*G11C 7/22* (2006.01)
*G01R 31/317* (2006.01)
(Continued)

(52) U.S. Cl.
CPC .......... *G11C 7/222* (2013.01); *G01R 31/3177* (2013.01); *G01R 31/31727* (2013.01); *G11C 7/1036* (2013.01); *H04L 43/106* (2013.01)

(58) Field of Classification Search
CPC ................. G11C 7/222; G11C 7/1036; G01R 31/31727; G01R 31/3177; H04L 43/106;
(Continued)

(56) References Cited

U.S. PATENT DOCUMENTS 6,232,796 B1 5/2001 Batra et al.
6,809,664 B1 10/2004 Pereira
(Continued)

FOREIGN PATENT DOCUMENTS

WO 2013088173 A1 6/2013

OTHER PUBLICATIONS

IEEE 1149.7 Standard for Reduced-Pin and Enhanced-Functionality Test Access Port and Boundary-Scan Architecture, 2009, 1037 pages.
(Continued)

*Primary Examiner* — Ajay Ojha

(57) ABSTRACT

A data transmission interface for use in a first integrated circuit, for encoding and sending a data packet from the first IC to a second IC via a data bus having three data wires, the data transmission interface being arranged to generate three time-dependent binary signals which jointly encode the data packet, each of the signals being associated with a unique data wire of the data bus and spanning a temporal cycle T within which are defined six consecutive time stamps $T_1 \ldots T_6$ at which the signals are allowed to change logical state, the data transmission interface further arranged to transmit the signals to the second IC substantially in parallel on their respective data wires, wherein, irrespective of the data packet content: at each time stamp $T_1 \ldots T_6$ exactly one of the signals changes logical state; each signal changes logical state twice during the cycle; and in the first half of the cycle, all signals change from a logical low state to a logical high state or all signals change from a logical high state to a logical low state.

20 Claims, 6 Drawing Sheets

(51) Int. Cl.
*G01R 31/3177* (2006.01)
*G11C 7/10* (2006.01)
*H04L 12/26* (2006.01)

(58) Field of Classification Search
CPC ............. H04L 25/4904; H04L 25/4906; G06F 13/4295
See application file for complete search history.

(56) References Cited

U.S. PATENT DOCUMENTS

| | | |
|---|---|---|
| 6,934,898 B1 | 8/2005 | Goff |
| 9,110,133 B2 | 8/2015 | Wang et al. |
| 10,571,518 B1 | 2/2020 | Waayers et al. |
| 2005/0078021 A1 | 4/2005 | Cohen et al. |
| 2012/0081301 A1* | 4/2012 | Lin .................... G06F 3/04166 345/173 |
| 2016/0178697 A1 | 6/2016 | Whetsel |
| 2017/0039163 A1 | 2/2017 | Sejpal et al. |
| 2017/0192058 A1 | 7/2017 | Whetsel |
| 2020/0341937 A1* | 10/2020 | Schat .................. G06F 13/4278 |

OTHER PUBLICATIONS

Whetsel, Lee, "A High Speed Reduced Pin Count JTAG Interface," 2006 IEEE International Test Conference, 10 pages.
ON Semiconductor, "CAT25M01 EEPROM Serial 1-Mb SPI," Jun. 2018, Rev. 3, 14 pages.
Kawoosa et al., "Towards Single Pin Scan for Extremely Low Pin Count Test," 2018 31th International Conference on VLSI Design and 2018 17th International Conference on Embedded Systems, 6 pages.
Moreau et al., "Running scan test on three pins: yes we can!", 2009 IEEE International Test Conference, paper 18.1, 10 pages.

* cited by examiner

DATA TRANSMISSION CODE AND INTERFACE

FIELD

The disclosure relates to a data transmission interface for encoding and sending a data packet from a first integrated circuit (IC) to a second IC via a three-wire data bus. The disclosure also relates to a data receiving interface for receiving and decoding a data packet sent from a first IC, to a second IC via a three-wire data bus. The disclosure also relates to methods of data transmission and reception over a three-wire data bus.

BACKGROUND

High data rates are often desirable for data transmission to and from ICs. This is true not only for data transfer in an application mode in general, but also for system self-tests in the field, for when one IC accesses instruments of another IC and for performing scan tests.

Limited IC pin count and limited input/output (I/O) frequency often causes a bandwidth bottleneck. However, the timing mismatch between I/O cells of an IC is typically very low, e.g. less than 5% of the cycle time.

In many protocols, a continuously running clock signal is sent from the transmitter to the receiver over a dedicated clock wire, as is the case for example in the Serial Peripheral Interface (SPI). However, this not only ties up a bus wire purely for transmitting a clock signal, but also results in increased energy consumption and the potential for electromagnetic interference which can disturb other electronic devices.

It is an object of the present disclosure to provide data transmission and receiving interfaces, suitable for use in ICs, which are capable of a data transmission rate greater than 4 bits per cycle over a three-wire bus, without requiring a dedicated clock wire.

SUMMARY

According to a first aspect of the present disclosure, there is provided a data transmission interface for use in a first integrated circuit, IC, for encoding and sending a data packet from the first IC to a second IC via a data bus having three data wires, the data transmission interface being arranged to generate three time-dependent binary signals which jointly encode the data packet, each of the signals being associated with a unique data wire of the data bus and spanning a temporal cycle T within which are defined six consecutive time stamps $T_1 \ldots T_6$ at which the signals are allowed to change logical state, the data transmission interface further arranged to transmit the signals to the second IC substantially in parallel on their respective data wires, wherein, irrespective of the data packet content:

at each time stamp $T_1 \ldots T_6$ exactly one of the signals changes logical state;

each signal changes logical state twice during the cycle; and in the first half of the cycle, all signals change from a logical low state to a logical high state or all signals change from a logical high state to a logical low state.

Advantageously, full clock recovery is possible at the second IC, because at each time stamp $T_1 \ldots T_6$ one of the six signals is guaranteed to change logical state. Therefore it is not necessary to have a dedicated clock wire which advantageously means that all three bus wires can be used for data transmission. Furthermore, by not having a permanent clock wire, electromagnetic interference is reduced within and around the integrated circuits and hence the risk of disturbing neighbouring electronic devices is reduced. The absence of a dedicated clock also reduces the energy consumption of the integrated circuits and means that a phase-locked loop (PLL) or similar is not required at the receiving end. The data transmission interface is capable of combining 5 data channels into three bus wires which offers a higher data rate than the state-of-the-art dual data rate three-wire bus.

In one or more embodiments, the data transmission interface comprises a lookup table which stores, for each possible data packet (e.g. in the case of a 5-bits per cycle capacity there are $2^5=32$ possible unique data packets to consider), a set of values corresponding to the logical states of the three signals at each of the time stamps $T_1 \ldots T_6$ spanning the cycle. The data transmission interface may be arranged to determine, from the lookup table, the set of values corresponding to said data packet.

In one or more embodiments, the data transmission interface comprises three 6-bit shift registers, one associated with each signal. The data transmission interface may be arranged to load said set of values into the shift registers and thereafter shift said set of values out of the shift registers in parallel, thereby generating the three time-dependent binary signals.

In one or more embodiments, the data transmission interface comprises a clock generation circuit arranged to generate a transmitter clock signal that has rising or falling edges at each of the time stamps $T_1 \ldots T_6$. The clock generation circuit may be arranged to provide the transmitter clock signal to the shift registers to shift said set of values out of the three shift registers in parallel at time stamps $T_1 \ldots T_6$.

According to a second aspect of the present disclosure, there is provided a data receiving interface for use in a second integrated circuit, IC, for receiving and decoding a data packet sent from a first IC to the second IC via a data bus having three data wires, the data receiving interface arranged to receive three time-dependent binary signals which jointly encode the data packet, each of the signals being associated with a unique wire of the data bus and spanning a temporal cycle T within which are defined six consecutive time stamps $T_1 \ldots T_6$ at which the signals are allowed to change logical state, the data receiving interface further arranged to decode the data packet from the three signals, wherein, irrespective of the data packet content:

at each time stamp $T_1 \ldots T_6$ exactly one of the signals changes logical state;

each signal changes logical state twice during the cycle; and in the first half of the cycle, all signals change from a logical low state to a logical high state or all signals change from a logical high state to a logical low state.

In one or more embodiments, the data receiving interface comprises a clock recovery circuit arranged to receive the three signals and to generate a receiver clock signal which contains a clock edge or pulse at each of the time stamps $T_1$ to $T_6$.

In one or more embodiments, the clock recovery circuit comprises a first exclusive-or, XOR, gate, a second XOR gate and a delay module, which together are arranged to generate the receiver clock signal.

In one or more embodiments, the first XOR gate is arranged to receive the three signals and to provide a first XOR gate output to both the delay module and the second XOR gate, the second XOR gate also arranged to receive the output of the delay module, the second XOR gate output providing said receiver clock signal.

In one or more embodiments, the clock recovery circuit is further arranged to generate a system clock signal which contains exactly one clock pulse per cycle.

In one or more embodiments, the clock recovery circuit further comprises an OR gate, an AND gate, a third XOR gate and a delay flip-flop, which together are arranged to generate the system clock signal.

In one or more embodiments, the data receiving interface comprises a data recovery circuit arranged to receive the receiver clock signal and the three signals and to decode the data packet therefrom.

In one or more embodiments, the data recovery circuit comprises three 6-bit shift registers, one associated with each signal. The three shift registers may be arranged to be populated with values corresponding to the logical states of the three signals at each of the time stamps $T_1 \ldots T_6$. The three shift registers may be arranged to be triggered from the receiver clock signal.

In one or more embodiments, the data recovery circuit further comprises a lookup table which stores, for each possible data packet, a set of values corresponding to the logical states of the three signals at each of the time stamps $T_1 \ldots T_6$ spanning the cycle. The lookup table may be arranged to receive and convert the output contents of the shift registers to thereby decode the data packet.

In one or more embodiments, the time intervals between time stamps $T_1$ and $T_2$; $T_2$ and $T_3$; $T_4$ and $T_5$; and $T_5$ and $T_6$ are substantially one twelfth of the cycle duration, or at least 5% of the cycle duration.

In one or more embodiments, the time interval between time stamps $T_3$ and $T_4$ is at least one quarter of the cycle duration, preferably substantially one third of the cycle duration.

In one or more embodiments, time stamps $T_1$ and $T_6$ are offset from the beginning and end of the cycle respectively by a time interval of substantially one sixth of the cycle duration.

In one or more embodiments, the first half of the cycle contains time stamps $T_1$, $T_2$ and $T_3$. In one or more embodiments, the second half of the cycle contains time stamps $T_4$, $T_5$ and $T_6$.

In one or more embodiments all signals are in a logical low state at the beginning of the cycle. In one or more embodiments all signals are in a logical high state at the beginning of the cycle.

In one or more embodiments the data packet (i.e. each data packet to be transferred within one cycle) comprises 5 bits of data.

According to a third aspect of the present disclosure, there is provided a system comprising a first device having a data transmission interface according to the first aspect, a second device having a data receiving interface according to the second aspect and a data bus having three data wires connected between the first device and the second device.

In one or more embodiments, the first device is a production tester and the second device is an IC under test.

In one or more embodiments, the production tester is arranged to perform a scan test of the IC under test.

According to a fourth aspect of the present disclosure, there is provided a method of encoding and sending a data packet from a first circuit to a second circuit via a data bus having three data wires, the method comprising:

generating, at a data transmission interface of the first circuit, three time-dependent binary signals which jointly encode the data packet, each of the signals being associated with a unique wire of the data bus and spanning a temporal cycle T within which are defined six consecutive time stamps $T_1 \ldots T_6$ at which the signals are allowed to change logical state; and transmitting the signals to the second circuit substantially in parallel on their respective data wires, wherein, irrespective of the data packet content:

at each time stamp $T_1 \ldots T_6$ exactly one of the signals changes logical state;

each signal changes logical state twice during the cycle; and in the first half of the cycle, all signals change from a logical low state to a logical high state or all signals change from a logical high state to a logical low state.

According to a fifth aspect of the present disclosure, there is provided a method of receiving and decoding a data packet sent from a first circuit to a second circuit via a data bus having three data wires, the method comprising:

receiving, at a data receiving interface of the second circuit, three time-dependent binary signals which jointly encode the data packet, each of the signals being associated with a unique wire of the data bus and spanning a temporal cycle T within which are defined six consecutive time stamps $T_1 \ldots T_6$ at which the signals are allowed to change logical state; and decoding the data packet from the three signals at the data receiving interface, wherein, irrespective of the data packet content:

at each time stamp $T_1 \ldots T_6$ exactly one of the signals changes logical state;

each signal changes logical state twice during the cycle; and in the first half of the cycle, all signals change from a logical low state to a logical high state or all signals change from a logical high state to a logical low state.

Optional and advantageous features mentioned above relating to the first, second and third aspects may also apply, mutatis mutandis, to the fourth and fifth aspects.

BRIEF DESCRIPTION OF DRAWINGS

Embodiments will be described, by way of example only, with reference to the drawings, in which.

Figure 1:
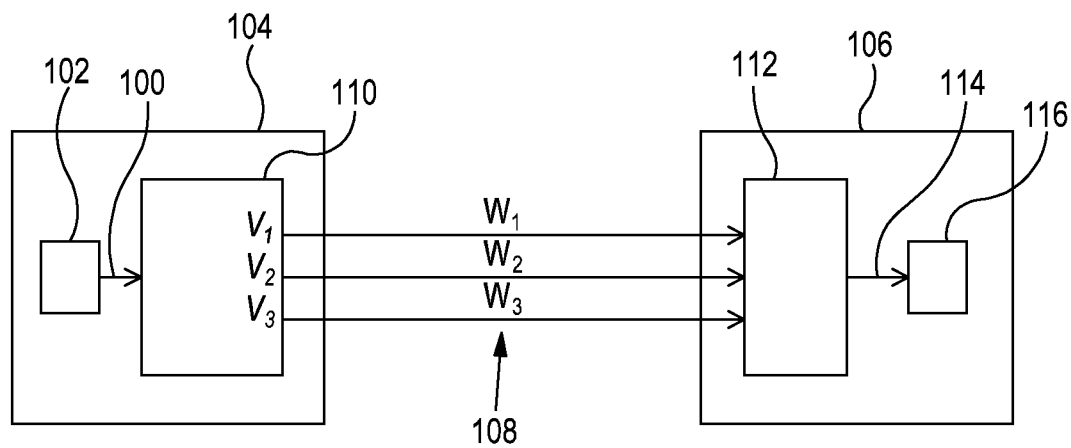
FIG. 1 illustrates schematically encoding and transmitting a data packet from a first IC to a second IC over a three-wire data bus.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments.

DETAILED DESCRIPTION OF EMBODIMENTS

According to the present disclosure, with reference to FIG. 1, a data packet 100 is generated in application logic 102 of a first integrated circuit (IC) 104, i.e. the transmitter IC, and is encoded and sent to a second IC 106, i.e. the receiver IC, via a data bus 108 having three data wires $W_1 \ldots W_3$ and without using a clock wire. The transmitter IC comprises a data transmission interface 110 which is arranged to generate three time-dependent binary (i.e. digital) signals $V_1 \ldots V_3$ which jointly encode the data packet. Each of the signals is associated with a unique data wire of the data bus 108. Each signal spans a temporal cycle of duration T within which are defined six consecutive time stamps $T_1 \ldots T_6$ at which the signals are allowed to change logical state, i.e. to change from a logical high state (or 1 state) to a logical low state (0 state) or vice versa. Each allowable set of the three time-dependent signals over a full cycle corresponds to a code word.

The signals are transmitted to the receiver IC substantially in parallel on their respective data bus wires. The receiver IC comprises a data receiving interface 112 which is arranged to receive the signals from the transmitter interface via the data bus and decode the original data packet to provide a recovered data packet 114 to application logic 116 of the receiver IC. It should be appreciated that the data bus 108 could have more than one receiving IC connected to it, each of which is capable of monitoring the data bus and 'listening' for a specific addressing signal, for example. Therefore, whilst the embodiments described herein describe a first IC in communication with a second IC over a data bus, it is to be understood that the disclosure also extends to a first IC in communication with two or more ICs over a data bus. Further, it should be appreciated that one or more ICs may have both a data transmission and a data receiving interface, as disclosed herein, such that said one or more ICs are capable of bi-directional communication of a data bus. Furthermore, it should be appreciated that data receiving and transmitting interfaces according to the present disclosure can be used in other devices/circuits, such as production testers and the like.

Figure 2:
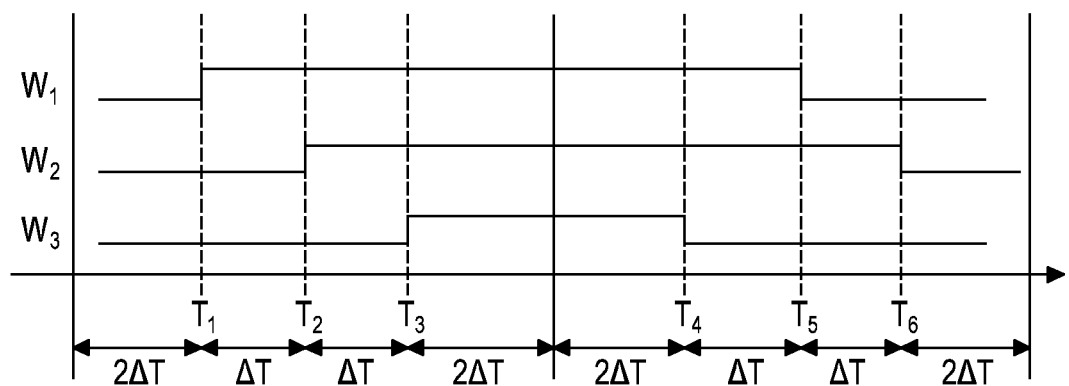
FIG. 2 illustrates three time-dependent binary signals jointly encoding a data packet for transmission over a three-wire data bus.

FIG. 2 illustrates an example code word representing a data packet being transmitted over the three wires of the data bus. According to the data encoding scheme, at each time stamp $T_1 \ldots T_6$ exactly one of the signals changes logical state. In other words, at each time stamp $T_1 \ldots T_6$ one and only one of the three signals changes logical state. The encoding scheme guarantees that this is always the case, irrespective of the content of the data packet being transmitted over the data bus.

Additionally, each signal changes logical state twice during the cycle, again irrespective of the data packet content. This means that each signal begins and ends a cycle in the same logical state. In one embodiment, illustrated in FIG. 2, the three signals all start the cycle in a logical low state and end the cycle in a logical low state. However, alternatively the three signals could all be in a logical high state at both the start and end of each cycle. Furthermore, in the first half of the cycle, i.e. across time stamps $T_1 \ldots T_3$, all three signals change from a logical low state to a logical high state, or all three signals change from a logical high state to a logical low state. In the second half of the cycle, i.e. across time stamps $T_4 \ldots T_6$ all three signals change back to their initial state.

Because at each time stamp $T_1 \ldots T_6$ exactly one of the signals changes logical state, it is always possible to recover a clock signal locally at the receiver IC, thereby not requiring a dedicated clock signal to be transmitted from to the transmitter IC to the receiver IC over a dedicated clock wire. This allows all wires of the data bus to be used for transmitting data without needing a dedicated clock wire and hence maximizes the possible data bandwidth over the three-wire bus.

In the illustrated embodiment, time intervals $\Delta T$ between time stamps $T_1$ and $T_2$; $T_2$ and $T_3$; $T_4$ and $T_5$; and $T_5$ and $T_6$ are all substantially one twelfth of the cycle duration T In the illustrated example, the time interval between time stamps $T_3$ and $T_4$ is one third of the cycle duration T. Therefore, a duration of one sixth the cycle duration T occurs at the beginning and end of the cycle where no signal state changes occur, e.g. to act as a buffer between adjacent cycles. It should be appreciated that variations on these timing intervals may be made without departing from the scope of the present disclosure. However, in general it is desirable that the time interval between time stamps $T_3$ and $T_4$ is at least twice the time interval $\Delta T$ between the other time stamps, e.g. three or four times said time interval. The duration at the beginning and end of the cycle where no signal state changes occur is modified accordingly and, in general, the duration at the beginning of the cycle where no signal state changes occur will be the same as the duration at the end of the cycle where no signal state changes occur. Furthermore, it is desirable that $\Delta T$ is greater than 5% of the cycle duration T, e.g. one twelfth of the cycle duration.

Based on the above exemplary encoding scheme, a data transfer capacity of the three-wire data bus of 5 bits per cycle can be achieved. This can be understood by considering the different combinations of signal state changes that can occur (i.e. code words) whilst still respecting the constraints set out above. For the rising or falling edges at $T_1 \ldots T_3$ there are six possible combinations. These are summarized in Table 1 below where e.g. row 1 of the table means that the signal on wire 1 changes state at $T_1$, the signal on wire 2 changes at $T_2$ and the signal on wire 3 changes at $T_3$.

TABLE 1

| $T_1$ | $T_2$ | $T_3$ |
|---|---|---|
| $W_1$ | $W_2$ | $W_3$ |
| $W_1$ | $W_3$ | $W_2$ |
| $W_2$ | $W_1$ | $W_3$ |
| $W_2$ | $W_3$ | $W_1$ |
| $W_3$ | $W_1$ | $W_2$ |
| $W_3$ | $W_2$ | $W_1$ |

Likewise, for the falling or rising edges at $T_4 \ldots T_6$ there are also six possible combinations. These are summarized in Table 2 below where e.g. row 1 of the table means that the signal on wire 1 changes state at $T_4$, the signal on wire 2 changes at $T_5$ and the signal on wire 3 changes at $T_6$.

TABLE 2

| $T_4$ | $T_5$ | $T_6$ |
|---|---|---|
| $W_1$ | $W_2$ | $W_3$ |
| $W_1$ | $W_3$ | $W_2$ |

TABLE 2-continued

| $T_4$ | $T_5$ | $T_6$ |
|---|---|---|
| $W_2$ | $W_1$ | $W_3$ |
| $W_2$ | $W_3$ | $W_1$ |
| $W_3$ | $W_1$ | $W_2$ |
| $W_3$ | $W_2$ | $W_1$ |

Therefore, overall there are 6*6=36 possible combinations for how signal states can change within one cycle, according to the rules of the encoding scheme set out above. Using only 32 of these 36 possible combinations enables a 5 bit data packet to be transmitted in a single cycle. Hence the data transfer capacity of the 3-wire data bus according to the present disclosure is 5 bits per cycle. This is greater than the capacity of 4 bits per cycle which is achievable using a serial peripheral interface when employing a dual data rate code, where one wire of the three-wire bus is dedicated for transmitting a clock signal and the other two wires are used as data wires.

Figure 3:
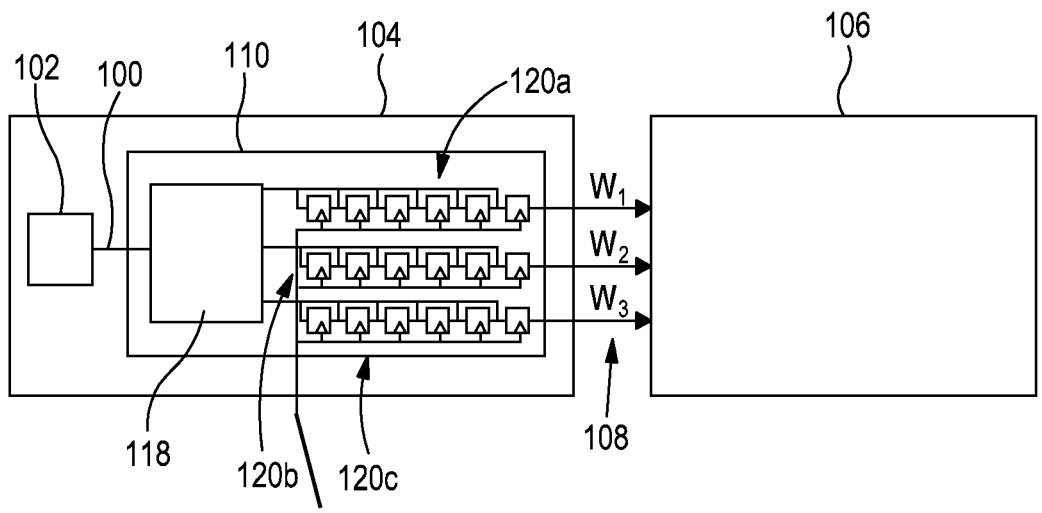
FIG. 3 illustrates schematically a data transmission interface.

An exemplary data transmission interface 110 according to the present disclosure is now described with reference to FIG. 3. The 5-bit data packet 100 to be encoded and sent is first generated in application logic 102 of the transmitter IC 104, which does not generally form part of the data transmission interface. In the data transmission interface the 5-bit data packet to be transmitted in a given cycle is fed into a lookup table 118 which for each of the 32 possible 5-bit data packet stores signal state values (i.e. logical high or low) of the signals/wires for each of the time stamps $T_1 \ldots T_6$. At the beginning of each cycle, these values are loaded in parallel into three 6-bit shift registers 120a, 120b, 120c, one associated with each of the 3 wires, and then shifted out serially and in synchronisation with each other to produce the three time-dependent binary signals jointly encoding the data packet. This process is repeated for each data packet to be transmitted over the bus, whereby a first cycle may immediately, or after some delay, be followed by a second cycle in which a second data packet is transmitted and so forth. The shift registers are clocked with a transmitter clock signal clock_TX that has active edges (i.e. rising or falling edges) at the times $T_1 \ldots T_6$. Accordingly, the data transmission interface may also include a clock generation circuit (not shown) arranged to generate the transmitter clock signal and trigger the flip-flops of the shift registers.

Figure 4:
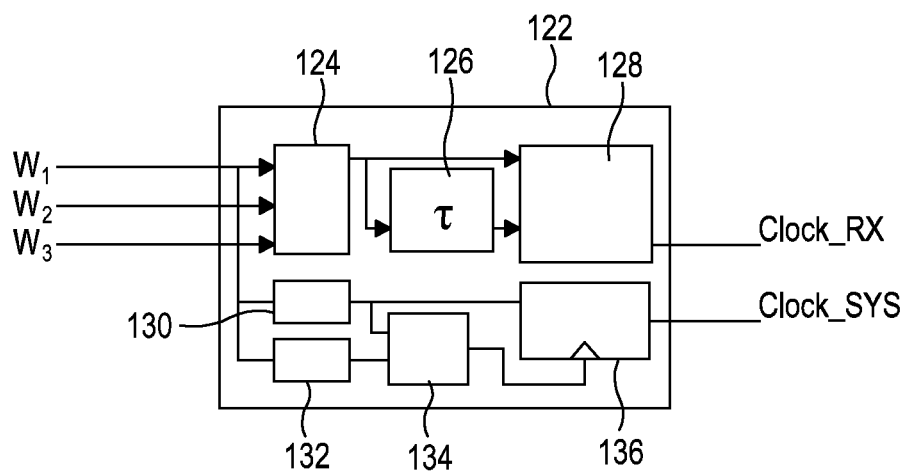
FIG. 4 illustrates schematically a clock recovery circuit for use in a data receiving interface.

As the bus 108 has no dedicated clock wire, since it does not need one according to the present disclosure, one or more clock signals are recovered locally in the receiving IC 106. This can be achieved by the exemplary clock recovery circuit 122 shown in FIG. 4. The clock recovery circuit comprises a first XOR gate 124 which receives the three time-dependent binary signals and provides outputs to both a delay module 126 and a second XOR gate 128. The second XOR gate also receives, as its second input, the output of the delay module. The delay module delays the output of the first XOR gate by a constant time r which is generally a small fraction of the cycle duration. The precision of this delay is not critical because the receiver clock signal clock_RX generated with it is only used internally within the data receiving interface 112. The first XOR gate 124, second XOR gate 128 and delay module 126, are together arranged to generate the receiver clock signal clock_RX, which contains a clock edge or pulse at each of the time stamps $T_1 \ldots T_6$.

In some embodiments, the clock recovery circuit 122 is further arranged to generate a system clock signal clock_SYS which contains exactly one clock pulse per cycle. The system clock signal is used by the application logic 116 of the receiver IC. The system clock signal may, for example, always have a rising edge at $T_1$ and always have a falling edge at $T_4$, irrespective of the data packet content, and hence can provide a clean, reliable clock with a 50% duty cycle for use by the application logic. To generate the system clock signal, the clock recovery circuit 122 also comprises an OR gate 130, an AND gate 132, a third XOR gate 134 and a delay flip-flop 136, which together are arranged to generate the system clock signal.

In the clock recovery circuit 122, the first XOR gate 124 changes its output state every time one of its three input signals changes state. Hence, at each of the time stamps $T_1 \ldots T_6$, this output changes its state. The output signal from the first XOR gate 124 and a delayed version of it are both fed to OR gate 128 which hence has its output at logic 1 in the time interval from a signal change of the output of first XOR gate 124 until the time interval r later. Then, the output of second XOR gate 128 stays at logic 0 until the next time stamp. The output of second XOR gate 128 hence has rising edges at each of the time stamps $T_1 \ldots T_6$, and falling edges that occur a time r after each time stamp.

Figure 5:
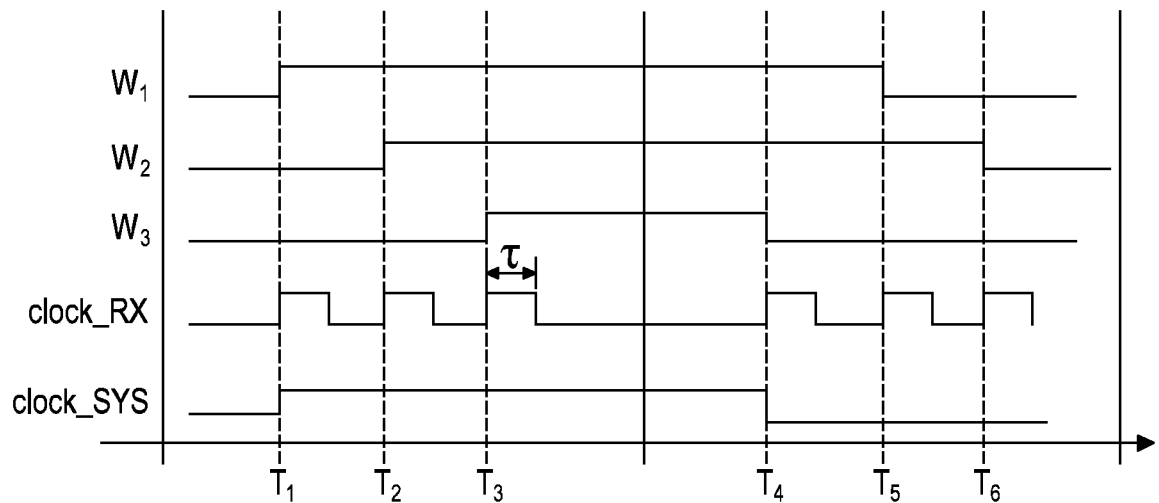
FIG. 5 illustrates receiver and system clock signals recovered in a clock recovery circuit of a data receiving interface.

The OR gate 130 has an output logic 1 in the whole time between $T_1$ and $T_6$ (as in this time interval, at least one of the signals is logic 1). The AND gate 132 has an output logic 1 in the whole time between $T_3$ and $T_4$ (as in this time interval, all three signals are logic 1). The output of the third XOR gate 134 is hence 1 between $T_1$ and $T_3$, and between $T_4$ and $T_6$. It has thus rising edges at $T_1$ and $T_4$. Using this signal as a clock signal for the delay flip-flop 136 yields a clock signal clock_sys as shown in FIG. 5 which illustrates exemplary receiver and system clock signals recovered in the clock recovery circuit 122 for an example set of three time-dependent binary signals received on wires $W_1 \ldots W_3$. The receiver clock signal clock_RX has a clock pulse at each of the time stamps $T_1 \ldots T_6$ with the pulses each having a width τ corresponding to the delay introduced by the delay module 126. The system clock signal clock_SYS has a rising edge at $T_1$ and a falling edge at $T_4$.

Figure 6:
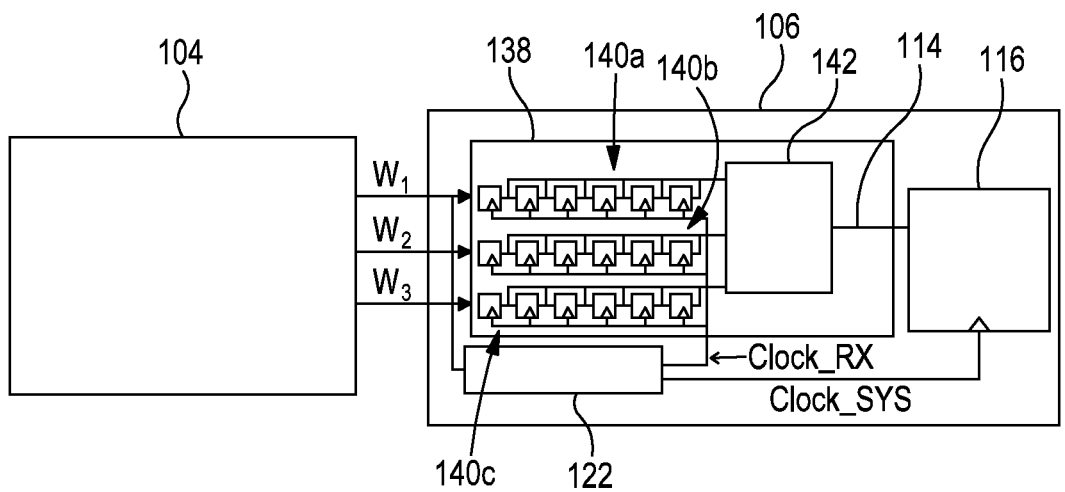
FIG. 6 illustrates schematically a data receiving interface.
Figure 7:
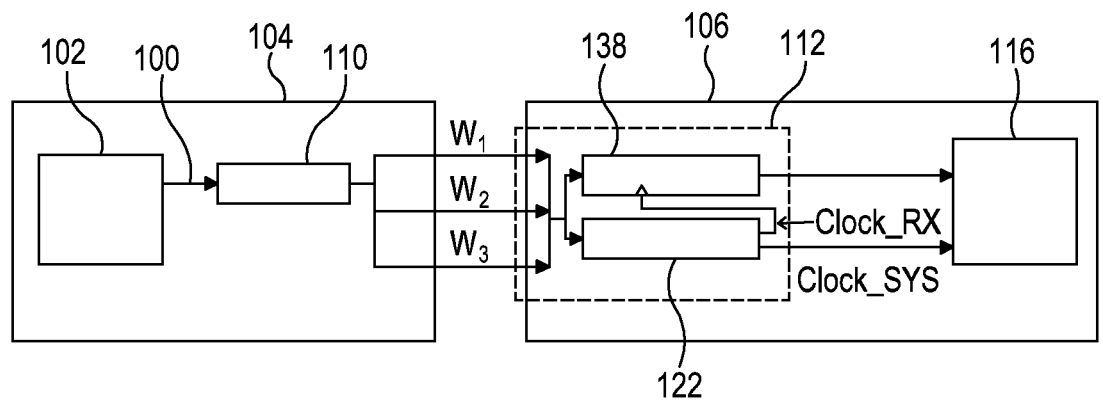
FIG. 7 illustrates a schematic overview of hardware for data transmission between two ICs over a three-wire data bus.

An exemplary data receiving interface 112 according to the present disclosure is now described with reference to FIG. 6. The receiver interface 112 forms part of a receiver IC 106 which may also include an application logic portion 116 which receives the recovered data packet 114 from the receiver interface as an input and performs some user-defined processing on it. The data receiving interface comprises a clock recovery circuit 122, such as that described above with reference to FIGS. 4 and 5, in addition to a data recovery circuit 138. The incoming signals on data wires $W_1 \ldots W_3$ are sent to both the clock recovery circuit 122 and the data recovery circuit 138. In addition, the receiver clock signal clock_RX is fed from the clock recovery circuit to the data recovery circuit 138. The data recovery circuit comprises three 6-bit shift registers 140a, 140b, 140c, similar to the three 6-bit shift registers used in the data transmission interface. One shift register is associated with each data wire. The three shift registers are arranged to be populated with values corresponding to the logical states of the three signals at each of the time stamps $T_1 \ldots T_6$. This is achieved by clocking the shift registers from the receiver clock signal clock_RX. The data recovery circuit further comprises a lookup table 142 which stores, for each possible 5-bit data packet, a set of values corresponding to the logical states of the three signals at each of the time stamps $T_1 \ldots T_6$ spanning the cycle. The lookup table is arranged to receive the output values of the three shift registers 140a, 140b, 140c and convert the values to provide a decoded/recovered data packet 114, e.g. for use by receiver application logic 116, which it will be appreciated generally falls outside of the data receiving interface according to the present disclosure. The lookup table is similar to that described above with reference to the data transmission interface FIG. 7 is an overview of exemplary hardware for data transmission between two ICs over the 3-wire data bus according to an example embodiment. Such transmission from IC to IC is often used e.g. between a frontend IC sensing or receiving data, and a backend IC performing analysis of these data. Such transmission is also often used for system self-test in the field, where the application mode is interrupted in regular intervals and e.g. a CPU accesses analogue or mixed-signal instruments of another IC for verifying correct operation, e.g. using an IEEE 1687-compliant infrastructure. Specifically, a first IC 104 comprises application logic 102 generating a data packet 100 which is encoded and transmitted, by the data transmission module 110, as three time-dependent binary signal over three data wires $W_1 \ldots W_3$ of a data bus, and without using a clock wire. At a second IC 106 connected to the data bus, the three signals are split between a clock recovery circuit 122 and a data recovery circuit 138 of a data receiving interface 112. The clock recovery circuit provides a receiver clock signal clock_RX, used by the data recovery circuit, and a system clock signal clock_SYS, used by application logic 116 of the second IC. The data recovery circuit decodes the three signals, using the receiver clock signal, to provide a decoded/recovered data packet 114 to the application logic 116 of the second IC.

In addition to data transmission from a first IC to a second IC, the present disclosure also covers the transmission from a production tester to an IC, such as a device under test (DUT), over a 3-wire data bus. This may be used to perform a scan test of ICs with limited pin count but where a high data rate is nevertheless desirable. Although a scan test is usually performed prior to device delivery using a production tester, a scan test may also be performed in the course of functional safety, e.g. during every start-up of a system containing the device. In many implementations of scan test design for testing (DFT) logic, the information as to whether the scan test is e.g. a transition test or a stuck-at test is transferred to the IC under test in an initialization sequence prior to transmission the actual scan patterns. A scan shift enable (SE) bit is often fed into the IC under test on a separate wire. Hence typically 5 scan channels require 11 IC pins: 5 for scan in, 5 for scan out and 1 for SE. According to the present disclosure, the SE bit can be generated internally within the IC under test and therefore it is advantageously possible to encode 11 internal scan bits (5 input, 1 scan control, 5 scan out) using only 6 external wires (3 input wires and 3 output wires).

As set out above, e.g. with reference to Tables 1 and 2, according to encoding schemes of the present disclosure, 36 combinations exist for how signal logical states can be distributed across the three wires of a bus. In the examples of data transmission from a first IC to a second IC, outlined above, only 32 of these 36 combinations were used, to encode a 5-bit data packet. The additional 4 combinations have utility in performing a scan test as will now be described. The data word output by the lookup table in the production tester splits into the scan_in data to be shifted into the scan chain, and the shift-enable bit. Table 3 below shows how, for the purpose of production testing, the 36 possible code words can be used to encode 5 scan input bits of data, in addition to encoding some internal scan control signals.

TABLE 3

| Code Word | Meaning |
| --- | --- |
| 0-31 | Encoding scan input bits 1-5. |
| 32 | Following cycle is a dead cycle, without clock. |
| 33 | Following cycle is a stuck-at test normal mode, SE = 0. |
| 34 | Following cycle is a transition test normal mode, SE = 0. |
| 35 | TAP controller reset |

Figure 8:
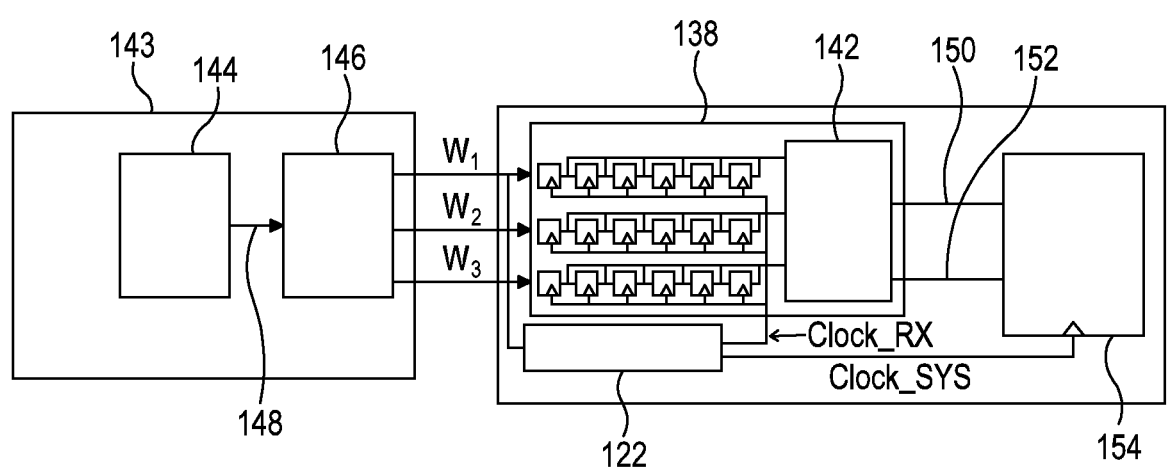
FIG. 8 illustrates a schematic overview of hardware for performing a scan test of an IC using a production tester.

A coarse overview of the hardware for performing a scan test of an IC using a production tester as transmitter is shown in FIG. 8. A production tester 143 generally consists of a pattern memory 144 and driver module 146 which receives scan data 148 from the pattern memory and transmits it to the IC under test over a three wire data bus $W_1 \ldots W_3$. The scan data may already be processed to the code used, e.g. as described in Table 3, and stored in the pattern memory. Hence, it may not be necessary for the production tester to include a lookup table, e.g. in the driver module 146. However, if the scan data is not already processed to the code used then the driver module 146 may include a lookup table for converting data from the pattern memory, encoding it according to the code used (e.g. of Table 3), and transmitting it over the 3-wire data bus to the IC under test. Otherwise the driver module may only include three 6-bit shift registers clocked by a transmitter clock signal as previously described. The IC under test 106 comprises a data receiving interface which is essentially the same as that described above, i.e. it includes a data recovery circuit 138 and a clock recovery circuit 122. The lookup table 142 of the data recovery circuit 138 is arranged to receive the outputs of the three 6-bit shift registers, in addition to the receiver clock signal clock_RX, and to provide two outputs: the retrieved scan_in data 150 and the SE bit 152. These are provided to the scan logic 154 within the IC under test. The scan logic is also provided with the system clock signal clock_SYS generated by the clock recovery circuit 122 in the manner previously described.

Figure 9:
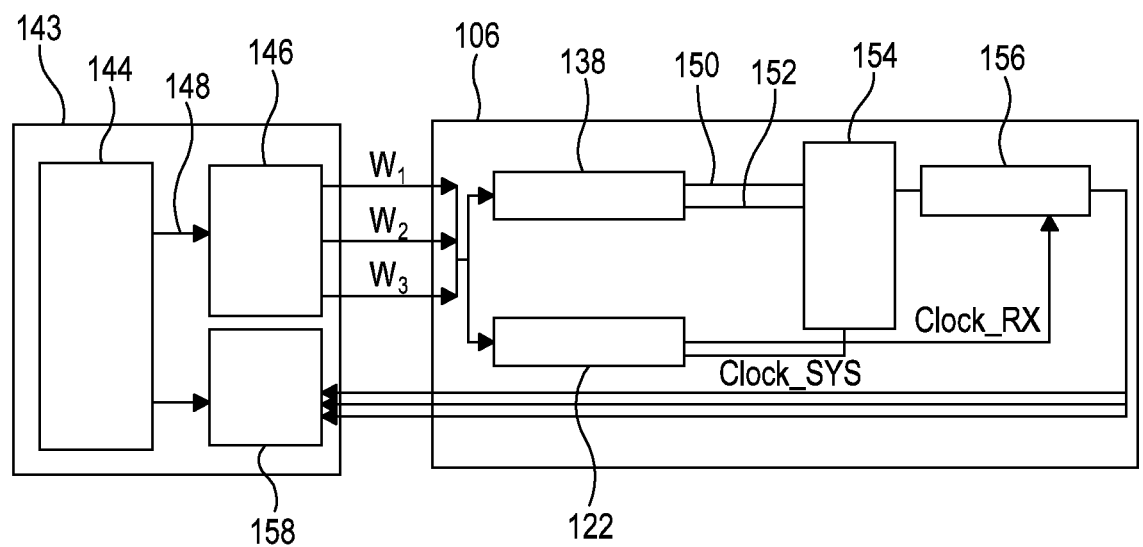
FIG. 9 illustrates further aspects of hardware for performing a production scan test of an IC.

FIG. 9 illustrates further aspects of a production test setup according to the present disclosure. This includes scan data 148 creation on the production tester 143, transmission to the receiving IC using drivers 146, decoding in the receiving IC 106 being tested, then subsequent encoding of the scan output data and transferring them back to the production tester. In order to encode the scan output data and transfer them back to the production tester, the IC being tested further includes a data encoding circuit 156 which operates in a similar manner to the data transmission interface 110 described above. The data encoding circuit 156 receives a 5-bit data packet from the scan logic 154, representative of the recovered output scan data, and encodes and transmits it back to the production tester over a 3-wire data bus. The production tester further includes a set of comparators 158 which are arranged to compare the original scan data sent from the production tester to the IC under test with the recovered scan data sent back to the production tester from the IC under test.

Figure 10:
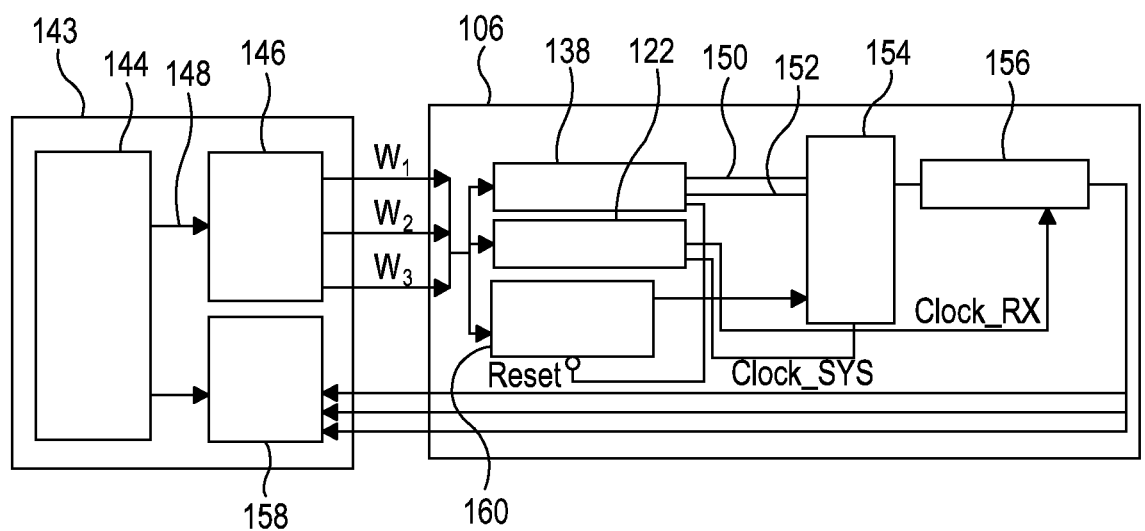
FIG. 10 illustrates interaction of a three-wire data bus and an on-chip test access port (TAP) controller.

It should be appreciated that the above-described production test setup, which effectively transfers 5 internal wires using 3 external bus wires, is independent of the specific test access and test control mechanisms being employed. It hence does not bundle JTAG connections and is not necessarily intended to convey JTAG control data. A possible interaction of the 3-wire data bus logic and an on-chip test access port (TAP) controller, according to the present disclosure, is outlined with reference to FIG. 10. FIG. 10 shares many elements in common with FIG. 9 and like reference numerals are therefore used where appropriate. In the embodiment of FIG. 10, the IC under test 106 additionally includes a TAP controller 160. The same three data bus wires $W_1 \ldots W_3$ are used for transferring scan data and the TAP controller data from the production tester 143 to the IC under test 106. It should therefore be ensured that the TAP controller stays in its programmed state once it has been programmed, i.e. that it is locked and can only be released from lock by a TAP controller reset command, e.g. code word 35 as per Table 3 above. During TAP controller initialization, the code word for TAP controller reset is not used. Furthermore, the scan_in 150 and SE signals 152 from the data recovery circuit 138 are gated appropriately using the TAP controller's control signals.

It should be appreciated that embodiments disclosed herein can be realised either in positive or in negative logic. In positive logic, which is the most common form, logic 0 corresponds to a lower voltage, while logic 1 corresponds to a higher voltage. In negative logic, logic 0 corresponds to a higher voltage. It should also be appreciated that whilst certain exemplary circuits have been disclosed which are arranged to encode and decode signals encoding a data packet according to the encoding scheme disclosed herein, alternative circuits could also perform the function of encoding and decoding data packets according to the disclosed encoding scheme utilizing three time-dependent binary signals.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality and reference signs in the claims shall not be construed as limiting the scope of the claims.

What is claimed is:

1. A data transmission interface in a first integrated circuit, IC, the data transmission interface module configured to encode and send a data packet from the first IC to a second IC via a data bus having three data wires, the data transmission interface being arranged to generate three time-dependent binary signals which jointly encode the data packet, each of the signals being associated with a unique data wire of the data bus and spanning a temporal cycle T within which are defined six consecutive time stamps $T1 \ldots T6$ at which the signals are allowed to change logical state, the data transmission interface further arranged to transmit the signals to the second IC substantially in parallel on their respective data wires, wherein, irrespective of the data packet content:

at each time stamp $T1 \ldots T6$ exactly one of the signals changes logical state;

each signal changes logical state twice during the cycle T; and in the first half of the cycle T, all signals change from a logical low state to a logical high state or all signals change from a logical high state to a logical low state.

2. The data transmission interface according to claim 1, comprising a lookup table which stores, for each possible data packet, a set of values corresponding to the logical states of the three signals at each of the time stamps $T1 \ldots T6$, the data transmission interface being arranged to determine, from the lookup table, the set of values corresponding to said data packet.

3. The data transmission interface according to claim 1, comprising three 6-bit shift registers, one associated with each signal, the data transmission interface being arranged to load a set of values into the shift registers corresponding to the logical states of the three signals at each of the time stamps $T1 \ldots T6$, and thereafter shift said set of values out of the shift registers in parallel, thereby generating the three time-dependent binary signals.

4. The data transmission interface according to claim 3, comprising a clock generation circuit arranged to generate a transmitter clock signal that has rising or falling edges at each of the time stamps $T1 \ldots T6$.

5. The data transmission interface according to claim 4, wherein the clock generation circuit is arranged to provide the transmitter clock signal to the shift registers to shift said set of values out of the three shift registers in parallel at time stamps $T1 \ldots T6$.

6. The data transmission interface according to claim 1, wherein the time interval between time stamps T3 and T4 is at least one quarter of duration of the cycle T, preferably substantially one third of the duration of the cycle T.

7. A data receiving interface for use in a second integrated circuit, IC, configured to receive and decode a data packet sent from a first IC to the second IC via a data bus having three data wires, the data receiving interface arranged to receive three time-dependent binary signals which jointly encode the data packet, each of the signals being associated with a unique wire of the data bus and spanning a temporal cycle T within which are defined six consecutive time stamps $T1 \ldots T6$ at which the signals are allowed to change logical state, the data receiving interface further arranged to decode the data packet from the three signals, wherein, irrespective of the data packet content:

at each time stamp $T1 \ldots T6$ exactly one of the signals changes logical state;

each signal changes logical state twice during the cycle T; and in the first half of the cycle T, all signals change from a logical low state to a logical high state or all signals change from a logical high state to a logical low state.

8. The data receiving interface according to claim 7, comprising a clock recovery circuit arranged to receive the three signals and to generate a receiver clock signal which contains a clock edge or pulse at each of the time stamps T1 to T6.

9. The data receiving interface according to claim 8, wherein the clock recovery circuit comprises a first XOR gate, a second XOR gate and a delay module, which together are arranged to generate the receiver clock signal.

10. The data receiving interface according to claim 8, wherein the clock recovery circuit is further arranged to generate a system clock signal which contains exactly one clock pulse per the cycle T.

11. The data receiving interface according to claim 8, wherein the data receiving interface further comprises a data recovery circuit arranged to receive the receiver clock signal and the three signals and to decode the data packet therefrom.

12. The data receiving interface according to claim 11, wherein the data recovery circuit comprises three 6-bit shift registers, one associated with each signal, the three shift registers arranged to be populated with values corresponding to the logical states of the three signals at each of the time stamps T1 . . . T6, and further arranged to be triggered from the receiver clock signal.

13. The data receiving interface according to claim 12, further comprising a lookup table which stores, for each possible data packet, a set of values corresponding to the logical states of the three signals at each of the time stamps T1 . . . T6 spanning the cycle T, the lookup table arranged to receive and convert the output contents of the shift registers to thereby decode the data packet.

14. The data receiving interface according to claim 7, wherein the time interval between time stamps T3 and T4 is at least one quarter of the cyclo duration of the cycle T, preferably substantially one third of the cycle duration of the cycle T.

15. A system comprising a first device, a second device and a data bus comprising three data wires, the first device and the second device being connected to the data bus,
the first device comprising a data transmission interface operable to generate three time-dependent binary signals which jointly encode a data packet, each of the signals spanning a temporal cycle T within which are defined six consecutive time stamps T1 . . . T6 at which the signals are allowed to change logical state, the data transmission interface being operable to transmit the three signals to the second device substantially in parallel on respective data wires of the data bus,
the second device comprising a data receiving interface operable to receive the three signals on the data bus and to decode the data packet from the three signals, wherein, irrespective of the data packet content:
at each time stamp T1 . . . T6 exactly one of the signals changes logical state;
each signal changes logical state twice during the cycle T; and
in the first half of the cycle T, all signals change from a logical low state to a logical high state or all signals change from a logical high state to a logical low state.

16. The system according to claim 15, wherein the first device is a production tester and the second device is an integrated circuit, IC, under test.

17. The system according to claim 16, wherein the production tester is arranged to perform a scan test of the IC under test.

18. The system according to claim 16, wherein the production tester comprises a pattern memory and a driver module.

19. The system according to claim 16, wherein the IC under test comprises a TAP controller.

20. The system according to claim 16, wherein the IC under test comprises a data encoding circuit operable to transmit recovered output scan data back to the production tester.

\* \* \* \* \*